US006914290B2

(12) United States Patent
Yoo et al.

(10) Patent No.: US 6,914,290 B2
(45) Date of Patent: Jul. 5, 2005

(54) SPLIT-GATE TYPE NONVOLATILE MEMORY DEVICES

(75) Inventors: Hyun-Khe Yoo, Suwon (KR); Jeong-Uk Han, Suwon (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/330,425

(22) Filed: Dec. 30, 2002

(65) Prior Publication Data

US 2003/0127684 A1 Jul. 10, 2003

(30) Foreign Application Priority Data

Jan. 7, 2002 (KR) ........................................ 2002-674

(51) Int. Cl.[7] ........................................ H01L 29/788

(52) U.S. Cl. ...................... 257/316; 257/317; 257/319; 257/320; 257/321; 257/322

(58) Field of Search ................................ 257/316–317, 257/319–322

(56) References Cited

U.S. PATENT DOCUMENTS

| | | | | |
|---|---|---|---|---|
| 5,045,488 A | | 9/1991 | Yeh | |
| 5,812,452 A | | 9/1998 | Hoang | |
| 5,936,883 A | | 8/1999 | Kurooka et al. | |
| 6,284,601 B1 | * | 9/2001 | Hoang | 438/258 |

* cited by examiner

*Primary Examiner*—Thien F Tran
(74) *Attorney, Agent, or Firm*—Harness, Dickey & Pierce, P.L.C.

(57) ABSTRACT

The nonvolatile memory device includes an electrically programmable transistor and a selection transistor. The selection transistor is connected between the electrically program transistor and a programmable voltage supply line. The selection transistor controls application of a voltage on the program voltage supply line to the electrically programmable transistor.

8 Claims, 9 Drawing Sheets

SPLIT-GATE TYPE NONVOLATILE MEMORY DEVICES

RELATED APPLICATION

This application relies for priority upon Korean Patent Application No. 2002-00674, filed on Jan. 7, 2002, the contents of which are herein incorporated by reference in their entirety.

FIELD OF THE INVENTION

The present invention relates to nonvolatile memory devices.

BACKGROUND OF THE INVENTION

The use of nonvolatile memory devices has been increasing over recent years. These devices can retain data even while no power is applied. Memory cells of nonvolatile memory devices can typically be divided into a NAND-type memory cell and a NOR-type memory cell. The NAND-type memory cell has the advantage of high integration while the NOR-type memory cell has the advantage of high speed. This enables use of the two kinds of memory cells depending on an application's required advantage.

In the NOR-type nonvolatile memory device, a plurality of memory cells, each of which includes a single transistor, are connected in parallel to one bit line. Only one memory cell transistor is arranged between a drain connected to the bit line and a source connected to a common source line. The NOR-type nonvolatile memory device includes a high current memory cell and may operate at high speed. However, the nonvolatile memory device of NOR-type is improper for high-integration because the bit line contact and source line consume a relatively large amount of semiconductor area.

Furthermore, in the event that a threshold voltage of a memory cell transistor falls below a certain voltage (typically 0V) applied to a control gate electrode of the memory cell transistor, a current flows between a source and a drain regardless of on/off state of a voltage applied to the gate of the transistor. Such a memory cell is thus read to be in the on-state, and a misoperation occurs. Accordingly, the nonvolatile memory device requires strict control of the threshold voltage.

To solve the foregoing problems, nonvolatile memory devices of different structures, normally called "split-gate type", have been proposed. A typical example of a split-gate type nonvolatile memory device is found in U.S. Pat. No. 5,045,488 entitled "METHOD OF MANUFACTURING A SINGLE TRANSISTOR NONVOLATILE, ELECTRICALLY ALTERABLE SEMICONDUCTOR MEMORY DEVICE".

FIG. 1 is a schematic cross-sectional view of a prior art, split-gate type nonvolatile memory device, and FIG. 2 is a circuit diagram showing a portion of a cell array of the prior art split gate type nonvolatile memory device.

Referring to FIG. 1, the prior art split-gate type nonvolatile memory device includes a common source region CSL formed in a predetermined portion of an active region of a semiconductor substrate 100 and a pair of floating gates 104*a* disposed on the semiconductor substrate on either side of the source region CSL. A top surface of each floating gate 104*a* is covered with an elliptical oxide layer 108. A control gate electrode WL is disposed on the semiconductor substrate 100 adjacent to each floating gate 104*a*, and extends from a sidewall of the floating gate 104*a* to cover a portion of a top surface of the elliptical oxide layer 108. The control gate electrodes WL for the pair of floating gates 104*a* are formed on opposite sides of the floating gates 104*a*. Namely, as shown in FIG. 1, the device is symmetrical about the source region CSL.

A drain region 128*d* is disposed in the semiconductor substrate 100 adjacent to each control gate electrode WL. A portion of each drain region 128*d* extends under an associated control gate electrode WL. A first gate insulation layer 102 is formed between the floating gate 104*a* and the semiconductor substrate 100. A second gate insulation layer is formed over the semiconductor substrate between the control gate electrode WL and the semiconductor substrate 100. The second gate insulation layer includes a tunnel insulation layer 112, which covers the floating gate 104*a*, and a first gate insulation layer 102, which is formed under the floating gate 104*a*. A bit line plug BC is connected to the drain regions 128*d* (connection not shown in FIG. 1).

In a write mode, when a high voltage of 12V or higher is applied to the source region CSL and an appropriate voltage is applied to the drain region 128*d* and a control gate electrode WL, hot electrons pass through the first gate insulation layer 102 and are injected into the floating gate 104*a* from the semiconductor substrate under the floating gate 104*a* adjacent to the control gate electrode WL. In an erase mode, if a voltage of 15V or higher is applied to the control gate electrode WL, a high electric field is applied to a tip T of the floating gate electrode 104*a*. Thus, the electrons are emitted from the floating gate 104*a* to the control gate electrode WL.

Referring to FIG. 2, a cell array of the prior art nonvolatile memory comprises a plurality of split-gate type cells disposed in a matrix. Memory cells in each column share a control gate electrode WL or line and a common source region CSL. Memory cells in a row have drain regions connected to a same bit line BL. Pairs of columns of memory cells are connected to a same common source line.

As discussed above, a memory cell is programmed by applying a high voltage, for example, 12V or higher, to the source region CSL. Typically a low voltage of about zero volts is applied to the drain region 128*d* and a relatively low voltage of about one volt is applied to the control gate electrode WL. Electrons generated by the source region CSL will flow from the source region CSL toward the drain region 128*d* through a weakly inverted channel underneath the control gate electrode WL. When the electrons reach the region where the control gate electrode WL meets the sidewall of the floating gate 104*a*, the electrons see a steep potential drop approximately equal to the drain voltage. The electrons will accelerate and become heated and some of them will be injected into the floating gate 104*a* through the first gate insulation layer 102. However, because numerous memory cells share the same source region, and not all of those memory cells are selected for programming, voltages are applied, if possible, to the control gate electrode WL and drain regions 128*d* of those unselected memory cells to prevent programming of the unselected memory cells. Unfortunately, during the programming process described above with respect to the selected memory cells, unwanted tunneling and programming of unselected memory cells can still occur. Furthermore, as the number of memory cells connected to a common source region CSL increases, the undesired tunneling and programming of unselected memory cells takes place more frequently. As a result, this unwanted tunneling effect has placed a limit on the number of memory cells which can be connected to a common source line CSL, and memory devices require the formation of more separated common source regions CSL.

SUMMARY OF THE INVENTION

In a nonvolatile memory device according to the present invention, a memory cell includes a memory transistor and a selection transistor. The memory transistor is an electrically programmable transistor. The selection transistor is connected between the electrically programmable transistor and a program voltage supply line. The selection transistor controls application of a voltage on the program voltage supply line to the electrically programmable transistor. Accordingly, during a programming operation, those memory cells being programmed have their selection transistors turned on such that a programming voltage for a memory cell is applied to the memory transistor. By contrast, those cells not selected for programming have their selection transistors turned off. This prevents the programming voltage from being applied to the memory transistor of those unselected memory cells. By use of the selection transistor, the unwanted tunneling and programming of unselected memory cells is prevented.

According to one exemplary embodiment of the present invention, the nonvolatile memory device includes a common source region, a cell region and a drain region disposed in a semiconductor substrate. A selection gate electrode is disposed on the semiconductor substrate between the common source region and the cell source region. A floating gate is disposed on the semiconductor substrate between the cell source region and the drain region, and the floating gate is laterally separated from the drain region. A control gate is disposed on a sidewall of the floating gate in the semiconductor substrate between the floating gate and the drain region. A tunnel oxide layer is disposed between the control gate electrode and the floating gate.

In another exemplary embodiment of the present invention, memory cells having the above structure are formed in an array such that a column of memory cells are connected to a single common source region, and in another embodiment, a pair of columns of memory cells are connected to the same common source region.

In another exemplary embodiment of the present invention, the nonvolatile memory device is fabricated by forming a gate insulation layer on a semiconductor substrate. A floating gate pattern is then formed on the gate insulation layer. Sequentially, a tunnel insulation layer and a gate conductive layer are formed on the semiconductor substrate to cover the floating gate pattern: The gate conductive layer is then patterned to form a control gate electrode on a sidewall and a portion of a top surface of the floating gate pattern and to form a selection gate electrode on the. semiconductor substrate separated from the floating gate pattern. The common source region, a cell source region, and a drain region are then formed in the semiconductor substrate. The cell source region is formed in the semiconductor substrate between the selection gate electrode and the floating gate pattern. The drain region is formed in the semiconductor substrate on an opposite side of the control gate electrode from the selection gate electrode. The common source region is formed in the semiconductor substrate on an opposite side of the selection gate from the floating gate pattern.

In a further exemplary embodiment of the present invention, the nonvolatile memory device is fabricated such that memory cells formed according to the previously described embodiment are formed in an array. In the array, a column of memory cells are connected to a common source region, and in yet another embodiment, a pair of columns of memory cells are connected to a common source region.

BRIEF DESCRIPTION OF THE DRAWINGS

FIGS. 6A through 10A are cross-sectional views taken along the line I–I' of FIG. 5 for illustrating a method of fabricating the nonvolatile memory device according to the exemplary embodiment of the present invention.

FIGS. 6B through 10B are cross-sectional views taken along the line II–II' of FIG. 5 for illustrating the method of fabricating the nonvolatile memory device according to the exemplary embodiment of the present invention.

DESCRIPTION OF THE PREFERRED EMBODIMENTS

Figure 1:
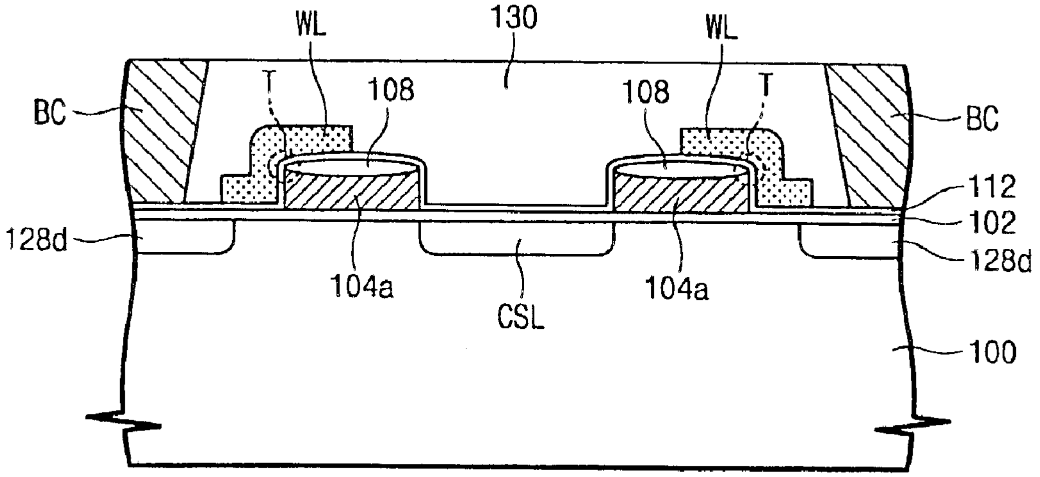
FIG. 1 is a schematic cross-sectional view of a prior art split-gate type nonvolatile memory device.
Figure 2:
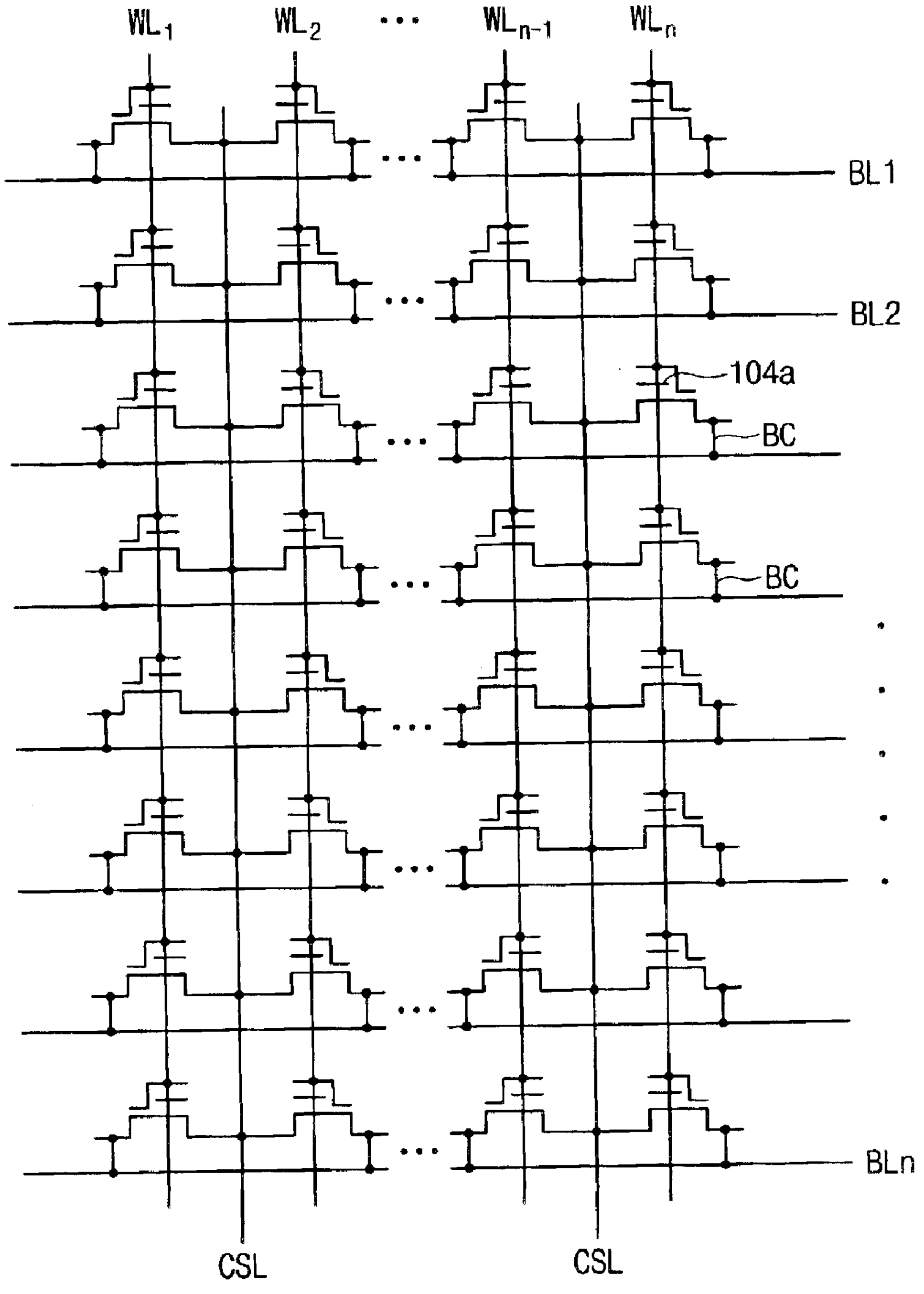
FIG. 2 is a circuit diagram showing a portion of a cell array of the prior art nonvolatile memory device in FIG. 1.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 3:
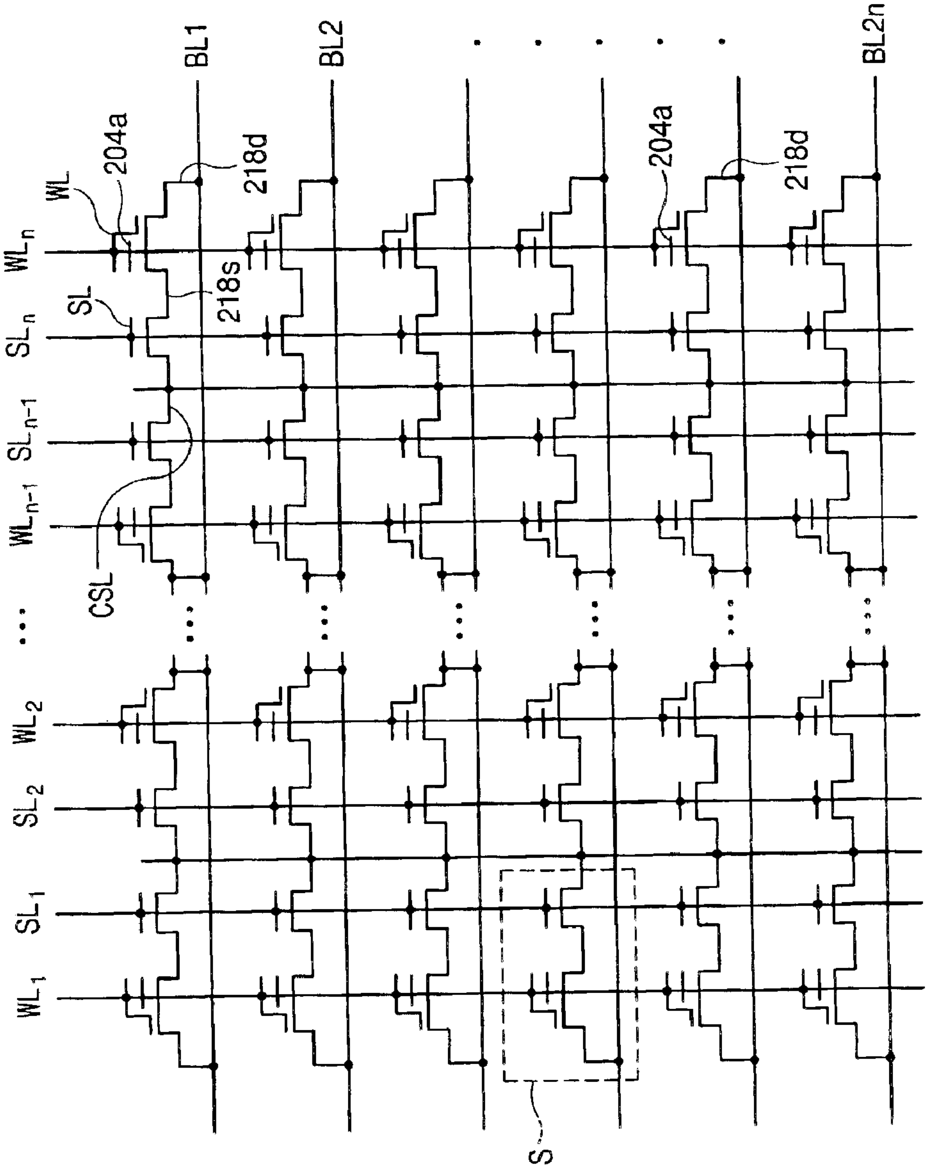
FIG. 3 is a circuit diagram of a cell array of a nonvolatile memory device according to an exemplary embodiment of the present invention.

FIG. 3 is a circuit diagram of a cell array of a nonvolatile memory device according to a an exemplary embodiment of the present invention.

Referring to FIG. 3, a plurality of memory cells S are arranged in a matrix. Each memory cell S includes a memory transistor 300 and a selection transistor 302. The memory transistor 300 includes a cell source region 218*s*, a floating gate 204*a*, a control gate electrode WL, and a drain region 218*d*. The selection transistor 302 includes the cell source region 218*s*, a common source region CSL, and a selection gate electrode SL. The control gate electrodes WL of the memory cells S in each column are electrically connected to form a word line $WL_X$. The selection gate electrodes in each column form a selection gate line $SL_x$. A pair of adjacent memory cells S face each other and share the common source region CSL. The common source regions CSL in each column are electrically connected, and the drain regions 218*d* in each column are connected to a bit line $BL_X$.

Figure 4:
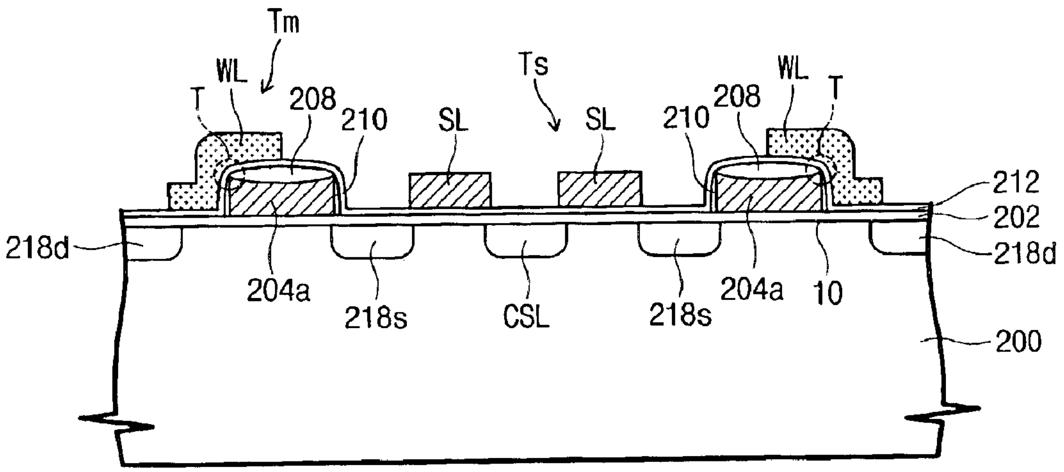
FIGS. 4 and 5 are a cross-sectional view and a perspective view of the nonvolatile memory device according to an exemplary embodiment of the present invention, respectively.
Figure 5:
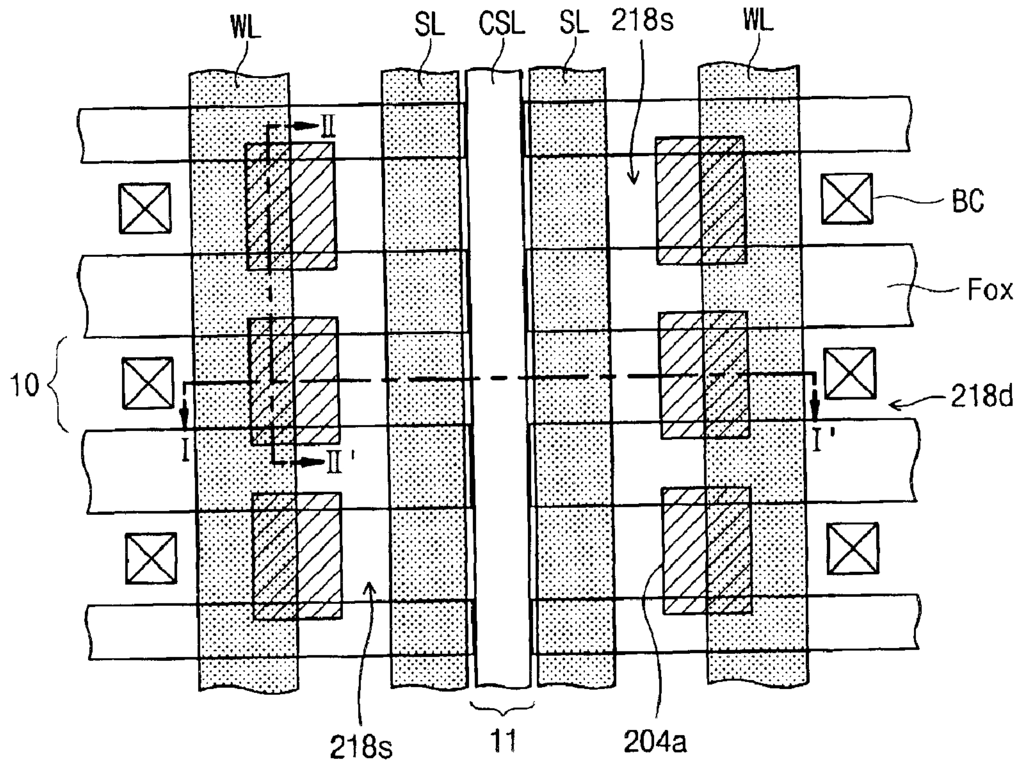

FIGS. 4 and 5 are a cross-sectional view and a perspective view of the nonvolatile memory device according to the preferred embodiment of the present invention. Referring to FIGS. 4 and 5, a plurality of active regions 10 are formed in a column on a semiconductor substrate. A common source region CSL crosses the active regions 10. The common source region CSL electrically connects the active regions 10. The common source region CSL may be a slit-shaped conductive layer pattern or a diffusion layer formed in another active region II crossing the active regions 10. A control gate electrode or line WL is disposed on either side of the common source region CSL to cross over the active regions 10. A selection gate electrode or line SL crosses over the active regions 10 between each control gate electrode 10 and the common source region CSL. A floating gate 204*a* is formed between each control gate electrode WL and each active region 10. A portion of a control gate electrode WL overlaps each floating gate 204*a*, and a portion of each floating gate 204*a* protrudes from a bottom of the overlapping control gate electrode WL to further cover a portion of the active region 10 adjacent to the overlapping control gate electrode WL. In addition, the overlapping control gate electrode WL extends from the sidewall of the floating gate 204*a* to cover a portion of the active region 10 adjacent to the floating gate 204*a*. A cell source region 218*s* is disposed in the active region 10 between each selection gate electrode SL and each floating gate 204*a*. Drain regions 218*d* are disposed in the active regions 10 adjacent to each control gate electrode WL. A bit line contact plug BC is connected to each drain region 218*d* (not shown in FIG. 4).

A top surface of each floating gate 204*a* is covered with an oxide layer pattern 208. The oxide layer pattern 208 may have an elliptical cross-section. Accordingly, the floating gate pattern 204*a* has a pointed edges T. A tunnel oxide layer 212 is disposed between each floating gate 204*a* and the overlapping control gate electrode WL, and a first gate insulation layer 202 is disposed between each floating gate 204*a* and the active region 10. The first gate insulation layer 202 extends under the floating gate 204*a*, and is disposed between each control gate electrode WL and the active region 10 and between each selection gate electrode SL and the active region 10. Also, the tunnel oxide layer 212 extends from the sidewalls of each floating gate 204*a*, and is disposed between each control gate electrode WL and the first gate insulation layer 202 and between each selection gate electrode SL and the first gate insulation layer 202. The first gate insulation layer 202 and the tunnel insulation layer 212, which are disposed between each control gate electrode WL and the active region 100 and between each selection gate electrode SL and the active region 10, constitute a second gate insulation layer. The sidewalls of each floating gate 204*a* may be covered with a sidewall oxide layer 210. Additionally, the second gate insulation layer on the active region 10 between the floating gate 204*a* and the selection gate electrode SL is not required.

FIGS. 6A through 10A are cross-sectional views taken along the line I–I' of FIG. 5 for illustrating a method of fabricating a nonvolatile memory device according to the exemplary embodiment of the present invention. FIGS. 6B through 10B are cross-sectional views taken along the line II–II' of FIG. 5 for illustrating the method of fabricating the nonvolatile memory device according to the exemplary embodiment of the present invention.

Figure 6A:
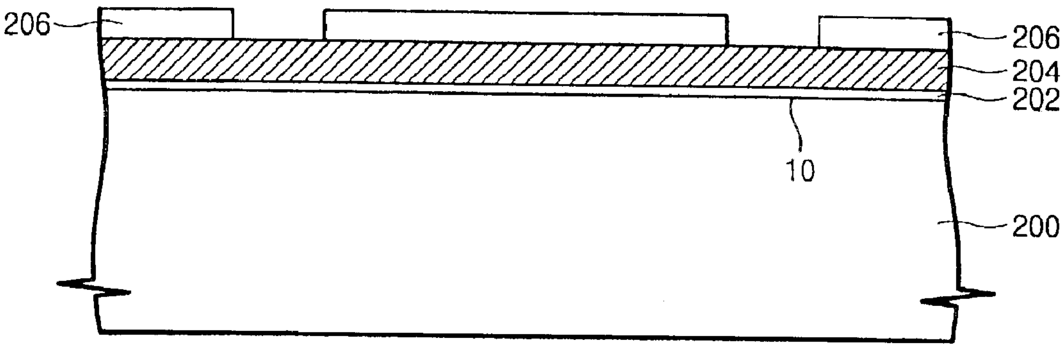
Figure 6B:
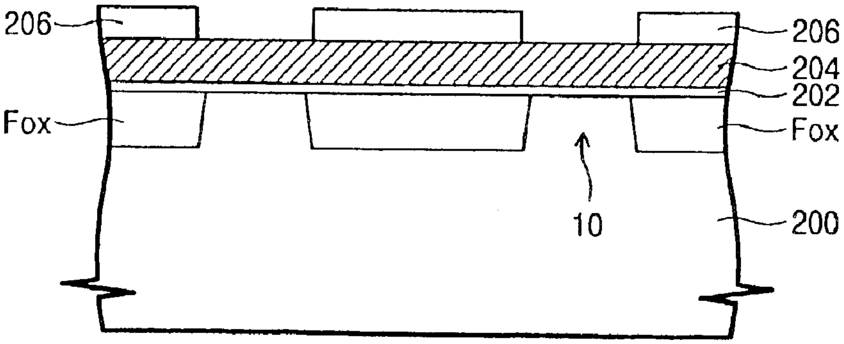

Referring to FIGS. 6A and 6B, a device isolation layer Fox is formed at a predetermined regions of a semiconductor substrate to define a plurality of active regions 10. Continuously, a conductive well is formed in the semiconductor substrate, and an ion implantation process may be implemented to control a threshold voltage of the device.

A first gate insulation layer 202, a floating gate conductive layer 204, and a hard mask layer are sequentially formed on the semiconductor substrate 200. The hard mask layer is patterned to form a mesh-shaped hard mask pattern 206 exposing predetermined portions of the floating gate conductive layer 204 on the active regions 10. The floating gate conductive layer 204 may be composed of doped polysilicon. By comparison, the floating gate conductive layer may be composed of undoped polysilicon. By using the hard mask pattern 206 as an ion implantation mask, impurities may be doped into the floating gate conductive layer. For example, the ion implantation process comprises implanting phosphorus into the floating gate conductive layer at an energy of 30 KeV and a dose of $2.7\times10^{14}$ ions/$cm^2$. The hard mask layer is preferably an insulation layer that cannot easily be oxidized, for example, a silicon nitride layer.

Figure 7A:
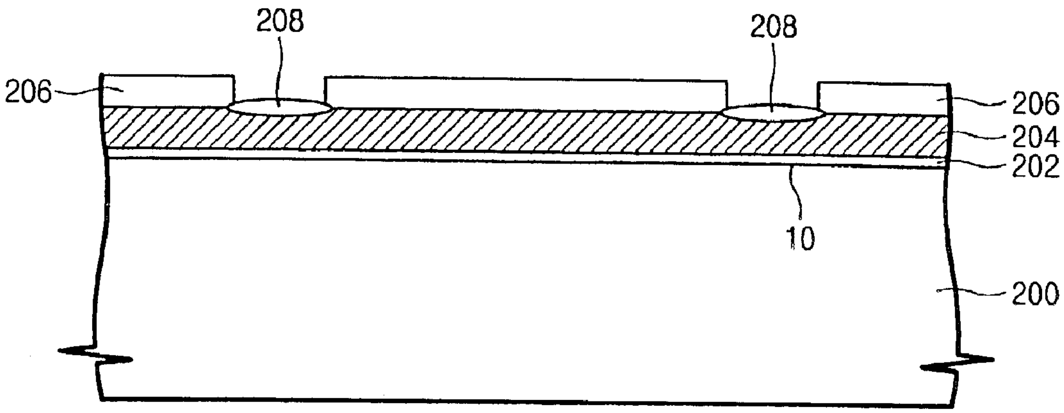
Figure 7B:
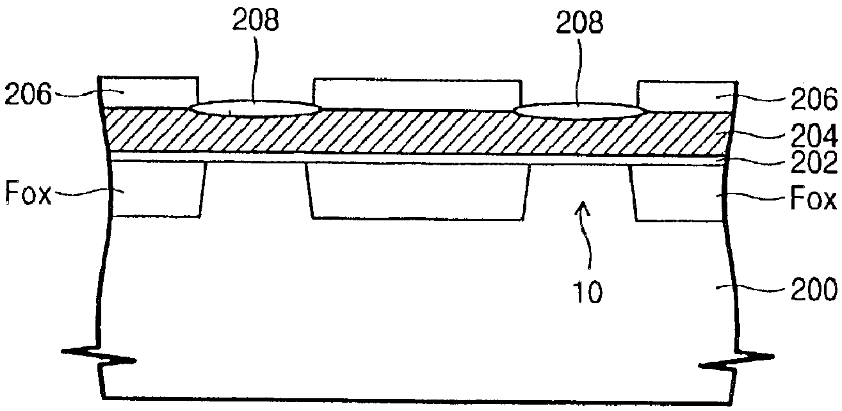

Referring FIGS. 7A and 7B, by using the hard mask pattern 206 as an oxidation barrier layer, a top surface of the exposed floating gate (conductive layer 204) is thermally oxidized to form oxide layer patterns 208. The oxide layer patterns 208 may have elliptical cross-sections.

Figure 8A:
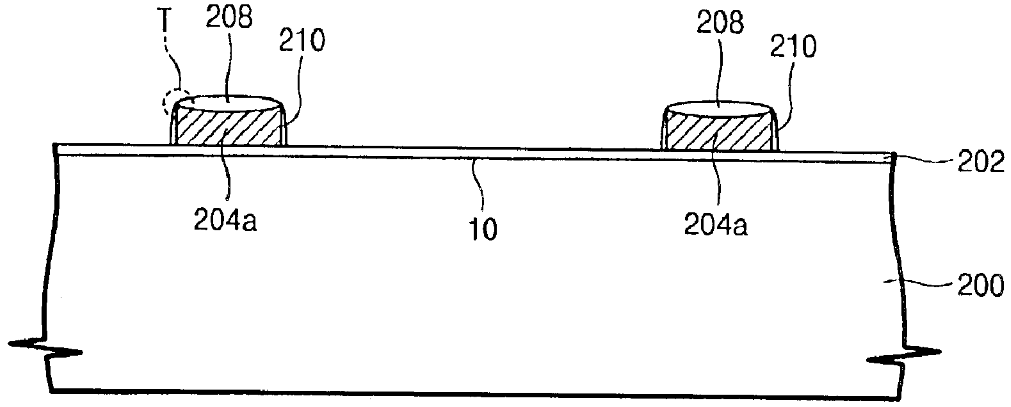
Figure 8B:
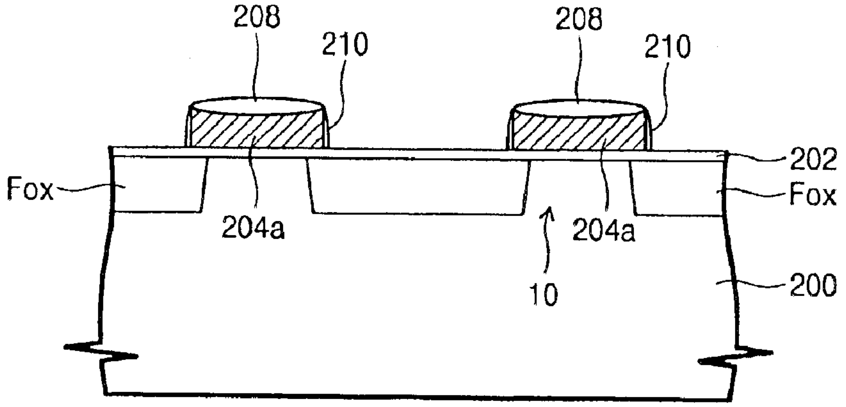

Referring to FIGS. 8A and 8B, the hard mask pattern 206 is removed. The floating gate conductive layer 204 is then patterned by using the oxide layer patterns 208 as an etch mask. This results in the formation of a plurality of island-shaped floating gates 204*a* on the semiconductor substrate 200. The floating gates 204*a* cover the active region 10 and are arranged in a matrix on the semiconductor substrate 200. Each floating gate 204*a* is covered with the oxide layer pattern 208 such that the floating gate 204*a* has a pointed tip edges T.

A thermal process is carried out into the resultant structure, thereby forming a sidewall oxide layer 210 on sidewalls of the floating gates 204*a*. The sidewall oxide layer 210 may be formed using dry oxidation to have a thickness of about 100 Å. Although not shown in the drawings, a nitride layer spacer may be additionally formed on sidewalls of the sidewall oxide layers 210. Preferably, a height of the nitride layer spacer is less than a height of the sidewall oxide layer 210. The nitride layer spacer is used to prevent unwanted tunneling into the floating gate 204*a* in the nonvolatile memory device. In the present invention, since a source selection transistor is used to prevent application of a high voltage to a memory transistor, it is not necessary to form the nitride layer spacer.

Figure 9A:
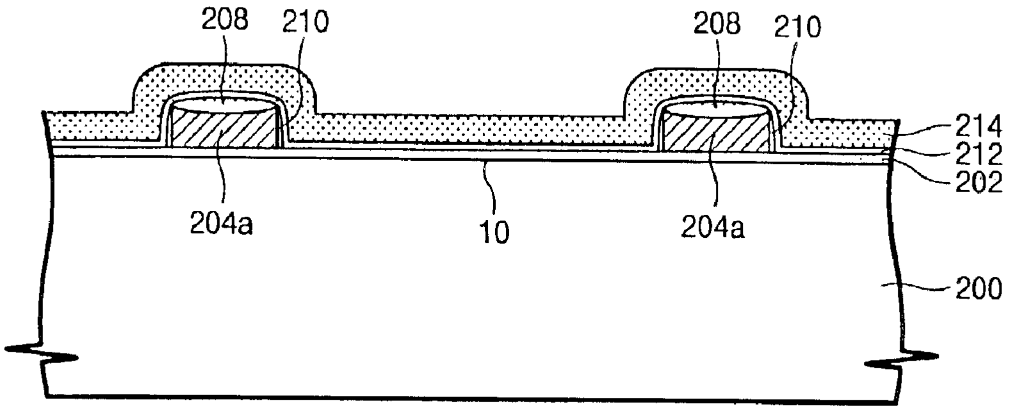
Figure 9B:
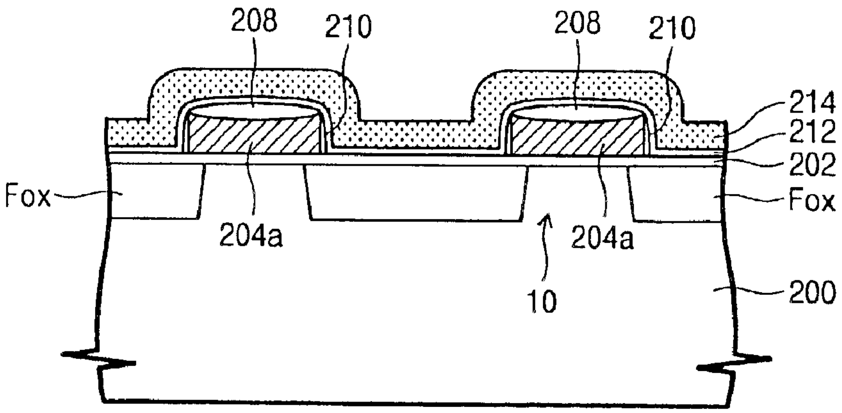

Referring to FIGS. 9A and 9B, a tunnel insulation layer 212 is formed on an entire surface of the resultant structure where the sidewall oxide layer 210 is formed. The formation process for the tunnel insulation layer 212 comprises conformally forming a high temperature oxide (HTO) layer, and then annealing the resultant structure where the HTO layer is formed. The HTO layer is preferably formed to have a thickness of about 100 Å, and annealed at 100° C. for 30 minutes to ensure reliability. Continuously, a gate conductive layer 214 is formed on an entire surface of the tunnel insulation layer 212. The gate conductive layer 214 may be composed of polysilicon or metal polycide.

Figure 10A:
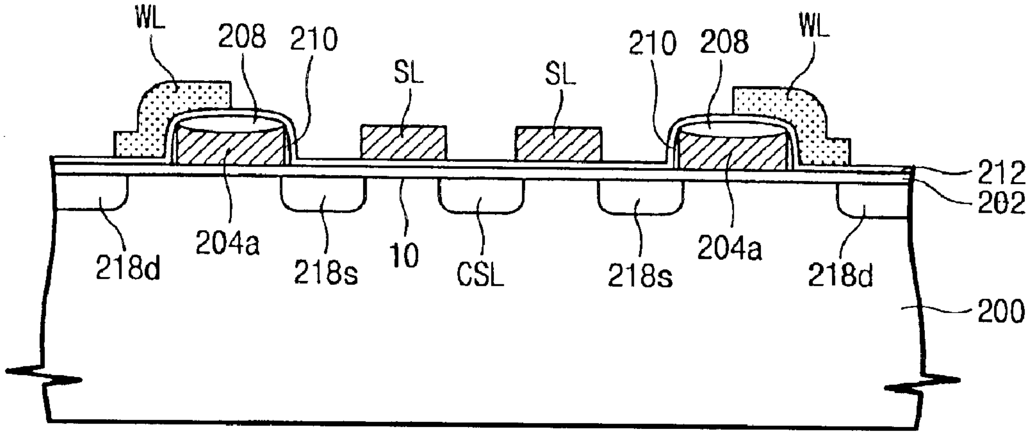
Figure 10B:
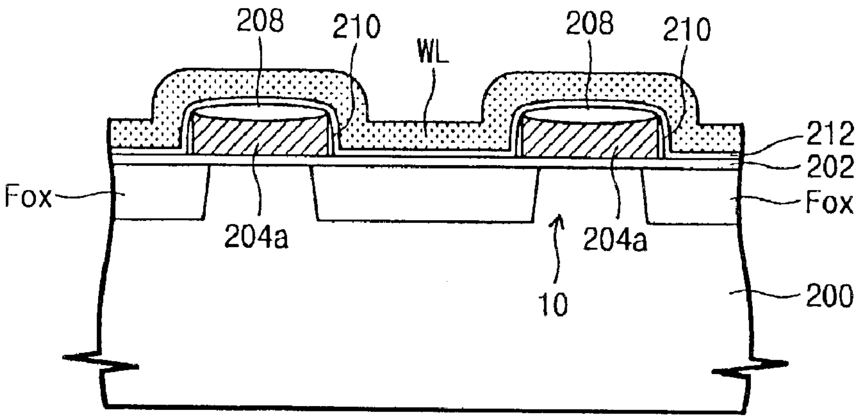

Referring to FIGS. 10A and 10B, the gate conductive layer 214 is patterned to form a plurality of control gate electrodes or lines WL and a plurality of selection gate electrodes or lines SL, which cross the active regions 10. Each control gate electrode WL is disposed on the floating gates 204*a* in a column. The overall structure, particularly with respect to the control gate and selection gate electrodes, is symmetric about each common source region CSL. In a cross-sectional view parallel with the active region 10, each control gate electrode WL is formed to cover a portion of a top surface of the floating gate 204*a* and a sidewall of the floating gate 204*a*. Each control gate electrode WL extends from the sidewall of the floating gate 204*a* to further cover the active region 10 adjacent to the floating gate 204*a*. Each floating gate 204*a* protrudes from a bottom of the overlapping control gate electrode WL toward the selection gate electrode SL so as to cover the active regions 10 adjacent to the floating gate 204*a*.

Impurities are implanted into the active regions 10 between the selection gate electrodes SL and between the selection gate electrodes SL and the floating gate electrodes 204*a*, thereby forming an impurity diffusion region. As a result, a common source region CSL is formed in the active region 10 between the selection gate electrodes SL, and a cell source region 218*s* is formed in the active regions 10 between the selection gate electrodes SL and the floating gate electrode 204*a*. Thereafter, drain regions 218*d* are formed in the active regions 10 adjacent to the control gate electrodes WL.

Although not shown in the drawings, an insulation layer having contact holes to the drain regions 218*d* are formed, and then an interlayer dielectric layer (ILD) is formed on an entire surface of the resultant structure. The ILD is patterned to form bit line contact plugs in the contact holes and a bit line parallel to each active region 10. Each bit line contact plug is connected to each drain region 218*d*, and the bit line for a row is connected to the bit line contact plugs in that row.

Preferably, the common source region CSL crosses the device isolation layers Fox to connect the active regions 10 in parallel with the selection gate electrode SL. For this, while forming the active regions 10, a source active region crossing the active regions 10 is additionally formed, thereby forming the common source region CSL in the source active region. In another method, slits are formed to penetrate the ILD such that the common source regions are exposed. A conductive layer is then filled in the slits, thereby crossing the active regions 10 to connect the common source regions.

Next, the programming erase and read operations for a memory cell according to the exemplary embodiment of the present invention will be described. When a memory cell S is to be programmed, a programming voltage on the order of plus 12 volts is applied to the common source region CSL acting as a program voltage line, a low voltage on the order of zero volts is applied to the drain region 218*d*, a relatively low voltage on the order of one volt is applied to the control gate electrode WL, and an on voltage (e.g., five volts) is applied to the selection gate electrode SL. The on gate voltage applied to the section gate electrode SL is a voltage high enough to turn on the selection transistor 302 such that the programming voltage applied to the common source region CSL is transferred to the source region 218*s* of the memory transistor 300. As a result, electrons in the source region 218*s* flow from the source region 218*s* toward the drain region 218*d* through a weakly inverted channel created by the voltage applied to the control gate electrode WL. When these electrons reach the region where the control gate electrode WL meets the sidewall of the floating gate 204*a*, the electrons see a potential drop approximately equal to the voltage at the drain. The electrons will accelerate and become heated and some of them will be injected into the floating gate 204*a*.

To program a memory transistor 300, which is an electrically programmable transistor, requires turning on the selection transistor 302. By contrast, unselected cells are prevented from being programmed by turning off the selection transistors 302 associated with the memory transistors 300 in the unselected cells. By maintaining the selection transistor 302 in an off unselected cell, the high programming voltage at the common source region CSL is not transferred to the source region 218*s* of the memory transistor 300, and the unwanted programming of unselected cells is prevented.

To erase a memory cell S, a ground potential is applied to the common source region CSL and to the drain 218*d*. The memory cell being erased has its selection transistor 300 turned on, and a high positive voltage on the order of plus 15 volts is applied to the control gate electrode WL. Charges on the floating gate 204*a* are then induced through the Fowler-Nordheim tunneling mechanism to tunnel from the floating gate 204*a* to the control gate electrode WL, leaving the floating gate 204*a* positively charged.

Finally, in a read cycle, a ground potential is applied to the drain region 218*d*, a transistor read voltage such as two volts is applied to the common source region CSL, and both the memory transistor 300 and the selection transistor 302 are turned on by applying a turn-on voltage (e.g., five volts) to the selection gate electrode SL and control gate electrode WL.

By using a selection transistor in the memory cell, the present invention prevents unselected memory cells from being programmed during the programming operation of selected memory cells. As a result, the number of memory cells having a single common source region can be greatly increased, and the number of common source regions needed in a memory cell array is greatly reduced. Therefore, the circuits for controlling each common source region can be decreased in number as well.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A nonvolatile memory device comprising:

a common source region, a cell source region and a drain region disposed in a semiconductor substrate;

a selection gate electrode disposed on the semiconductor substrate between the common source region and the cell source region;

a floating gate disposed on the semiconductor substrate between the cell source region and the drain region, the floating gate laterally separated from the drain region;

a control gate electrode disposed on a sidewall of the floating gate and the semiconductor substrate between the floating gate and the drain region;

a tunnel oxide layer disposed between the control gate electrode and the floating gate, the tunnel oxide layer being a CVD oxide layer; and a sidewall oxide layer interposed between the tunnel oxide layer and at least one sidewall of the floating gate, the sidewall oxide layer being a thermal oxide layer.

2. The device of claim 1, further comprising:

a first gate insulation layer between the floating gate and the semiconductor substrate and between the selection gate electrode and the semiconductor substrate; and wherein the tunnel oxide layer is disposed between the selection gate electrode and the semiconductor substrate.

3. The device of claim 1, wherein the control gate electrode extends from a sidewall of the floating gate electrode to cover a portion of the drain region.

4. The device of claim 1, further comprising:

an elliptical oxide layer pattern formed on the floating gate; and wherein the floating gate electrode has a pointed upper edge portion; and the control gate electrode is formed on a portion of a top surface of the elliptical oxide layer.

5. A nonvolatile memory device comprising:

a plurality of active regions disposed in a semiconductor substrate;

common source regions crossing the active regions, the common source regions connecting the active regions;

a cell source region and drain region pair disposed in the active region on each side of at least one common source region;

at least one selection gate line disposed between the common source region and each cell source region, each selection gate line crossing over the active regions;

a floating gate electrode laterally separated from each drain region and disposed on an active region between the cell source region and the drain region in a cell source region and drain region pair;

at least one control gate line disposed on a sidewall of a first number of floating gate electrodes and portions of the active region between each of the first number of floating gate electrodes and a first number of drain regions associated with the first number of floating gate electrodes, the control gate line crossing over the active regions;

a tunnel insulation layer is disposed between the first number of floating gate electrodes and the control gate line, the tunnel oxide layer being a CVD oxide layer; and a sidewall oxide layer interposed between the tunnel insulation layer and at least one sidewall of each of the first number of floating gate electrodes, the sidewall oxide layer being a thermal oxide layer.

6. The device of claim 5, further comprising:

an elliptical oxide layer pattern formed on each floating gate; and wherein the control gate electrode is formed on a portion of each elliptical oxide layer.

7. The device of claim 5, further comprising:

a first gate insulation layer between each of the first number of floating gate electrodes and associated ones of the active regions and disposed between the selection gate line and the active regions crossed by the selection gate line; and wherein the tunnel oxide layer is disposed between the selection gate line and the active regions crossed by the selection gate line.

8. The device of claim 5, further comprising:

a second active region crossing the active regions, wherein the common source region is formed in the second active region.

* * * * *